United States Patent [19]

Fischer et al.

[11] Patent Number: 5,302,860

[45] Date of Patent: Apr. 12, 1994

[54] CIRCUIT ARRANGEMENT FOR AUTOMATIC GAIN CONTROL

[75] Inventors: Jens Fischer; Jörg Jost, both of Darmstadt, Fed. Rep. of Germany

[73] Assignee: U.S. Philips Corporation, New York, N.Y.

[21] Appl. No.: 15,719

[22] Filed: Feb. 9, 1993

[30] Foreign Application Priority Data

Feb. 19, 1992 [DE] Fed. Rep. of Germany ....... 4204956

[51] Int. Cl.⁵ .......................... H04N 5/52; H03F 1/08
[52] U.S. Cl. .................................. 307/264; 307/359; 348/678
[58] Field of Search ............... 307/264, 311, 351, 359, 307/494; 358/161, 171, 174

[56] References Cited

U.S. PATENT DOCUMENTS 4,318,129  3/1982  Zwirn ................................. 358/174

FOREIGN PATENT DOCUMENTS 2500654  5/1976  Fed. Rep. of Germany .
285538  12/1990  German Democratic Rep. ..................................... 358/171

OTHER PUBLICATIONS

RCA Technical Notes, TN No. 1137, Dec. 19, 1975 Richard C. Blanchard "Automatic Black Level Set".
IBM Technical Disclosure Bulletin, vol. 15 No. 12, May 1973, H. H. Ottesen & G. G. Qvickstad "Adaptive D.C. Restoration" pp. 3779, 3780.
Electronics, Dec. 20, 1973, Roland J. Turner, "D.C. restorer for Video Use" pp. 114 & 115.
IEEE Transactions on Magnetics, vol. MAG. 14, No. 4, Jul. 1978, pp. 218 to 222.
NTZ, vol. 30 (1977), No. 9, pp. 712 to 717.
Concise Explanation of the Relevance of German Patent No. 2,500,654B1.

*Primary Examiner*—William L. Sikes
*Assistant Examiner*—Shawn Riley
*Attorney, Agent, or Firm*—Richard A. Weiss

[57] ABSTRACT

A circuit arrangement for automatic gain control of NRZ data signals. In this arrangement there is detected with the aid of two comparators whether a logic level in the NRZ data signal produced by a controllable amplifier is exceeded or fallen short of. The signals produced by the comparators are time-averaged with the aid of RC combinations and subjected to a logic AND combination. The signal available at the output of the AND combination is integrated in an integrator stage and transported as a control signal to a set input of the controllable amplifier.

21 Claims, 1 Drawing Sheet

CIRCUIT ARRANGEMENT FOR AUTOMATIC GAIN CONTROL

BACKGROUND OF THE INVENTION

The invention relates to a transmission system comprising a transmitter and a receiver coupled together by way of a channel, the receiver including a circuit arrangement for automatic gain control. The circuit arrangement includes a differential amplifier having an input for receiving a signal to be controlled, an output for presenting a controlled output signal and a control input for adjusting the gain as a function of a control signal; and a generator for producing the control signal by rectifying the output signal produced by the differential amplifier. The invention likewise relates to a receiver and a circuit arrangement for automatic gain control.

When serial data is optically transmitted, a photodiode arranged on the receiving side of a light waveguide converts light pulses obtained from a transmitter into an electric data signal. An AC-coupled preamplifier amplifies the low voltage level of the (converted, i.e., electrical) data signal to produce a logic voltage level necessary for driving integrated logic circuits. As a result of the AC coupling of the preamplifier, however, the DC component in the data signal is lost. The lost DC component may be recovered in a circuit having quantized feedback. Prior-art amplifier circuits having quantized feedback (IEEE Transactions on Magnetics, Vol. MAG. 14, No. 4, July 1978, pp. 218 to 222; NTZ, Vol. 30 (1977), No. 9, pp. 712 to 717), however, need to have at their input a data signal with a constant voltage level. Therefore, the quantized feedback circuit is to be preceded by a circuit arrangement for automatic gain control.

DE 25 00 654 B1 has already disclosed a circuit arrangement for level control of a data signal. This data signal forms part of a compound signal which is transmitted together with a pilot signal over a transmission link. Signals signalling the actual level and the nominal level of the pilot signal are then compared in a comparator, and, as a result, a control voltage is derived which is applied to a control stage controlling the level of the data signal. This prior-art circuit arrangement is unsuitable for maintaining the voltage level of data signals that do not have such a pilot signal at a constant level.

SUMMARY OF THE INVENTION

It is an object of the present invention to provide a transmission system of the type defined in the opening paragraph which is suitable for signals, especially NRZ encoded data signals, which contain rather long "0" or "1" sequences.

This object is achieved by way of the following features being included in the transmission system, and in at least one embodiment in the receiver, or more particularly in a circuit arrangement: a first comparator for presenting a first signal when the signal to be controlled exceeds a specific positive level, a second comparator for presenting a second signal when the signal to be controlled falls below a specific negative level, an average circuit for averaging the first and second signals, and a circuit for combining the two averaged signals if both the average value of the first and the average value of the second signal exceeds a specific level.

The system according to the invention having the features just mentioned is advantageous in that even when rather long "0" or "1" sequences occur in an NRZ data signal to be controlled, the level can be kept constant and, thus, in a connection with a quantized feedback circuit, the lost DC component in the NRZ data signal can be restored.

By implementing the measures defined herein and in the dependent claims, advantageous further embodiments and improvements of the circuit arrangement identified above are possible.

BRIEF DESCRIPTION OF THE DRAWINGS

An exemplary embodiment of the invention is shown in the drawings and will be further explained in the following description, in which.

DESCRIPTION OF THE PREFERRED EMBODIMENTS

Figure 1:
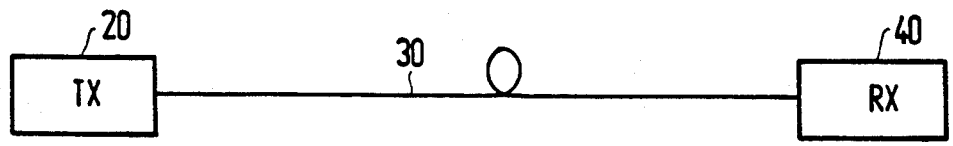
FIG. 1 shows a system in which the invention can be used.

FIG. 1 shows a transmission system comprising a transmitter coupled to a receiver by way of a channel. The channel may be formed, for example, by a glass fiber, a radio channel or a cable link. The channel may also be formed by a magnetic or optical recording system.

Figure 2:
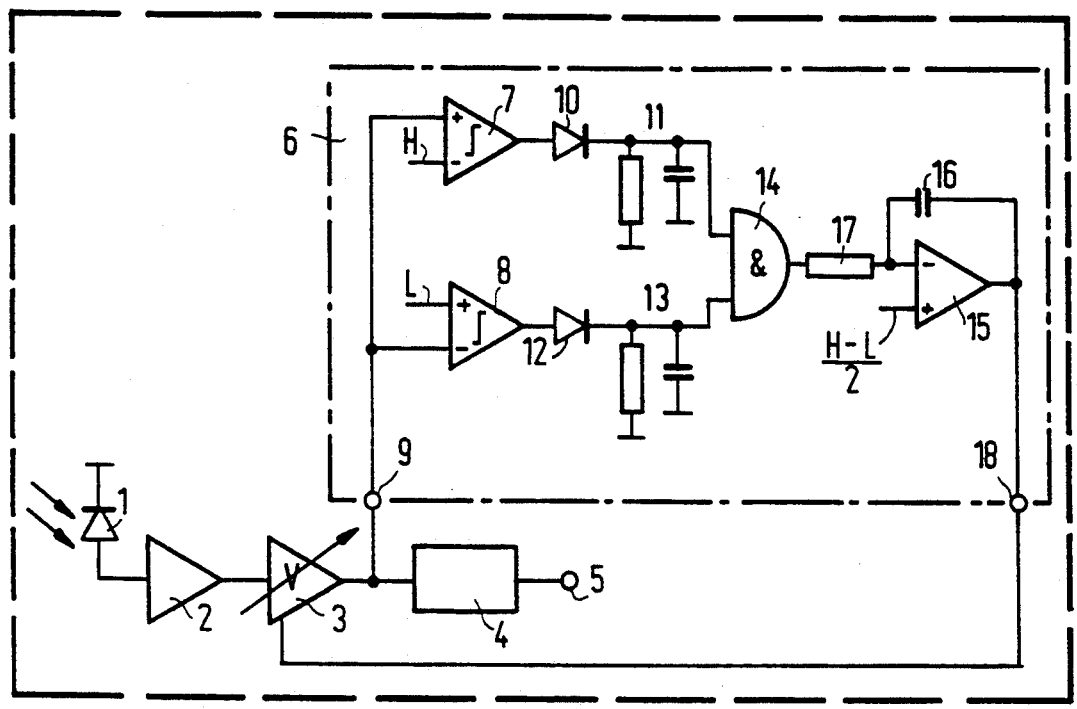
FIG. 2 shows a first embodiment of a circuit arrangement according to the invention.

In FIG. 2 a photodiode 1 is arranged on the receiving side of a light waveguide (not shown) for reconverting light pulses produced by the light waveguide into an electric data signal. The voltage level of the data signal obtained at the output of the photodiode 1 is only a few millivolts. Therefore, it is necessary to amplify the data signal produced by the photodiode 1 to drive integrated logic circuits downstream in the arrangement. However, customary DC-coupled amplifiers present drift, so that, when there is a lot of gain, the received data signal is limited and, thus, distorted non-linearly. To avoid such disadvantages, the data signal produced by the photodiode 1 is amplified by an AC-coupled preamplifier 2 which, suppresses the DC component contained in the data signal, Hence, a NRZ data signal amplified by the AC-coupled preamplifier 2 fluctuates around an average DC voltage level in response to an occurring bit sequence.

To recover the lost DC component in the amplified data signal, the output of the AC-coupled preamplifier 2 is connected to the input of a controllable amplifier 3 whose output signal is transported through a quantized feedback circuit 4 which applies a data signal having a DC component to a terminal 5. As defined in the opening paragraph, quantized feedback circuits need to have a constant amplitude level of their inputs. The controllable amplifier 3 inserted between the AC-coupled preamplifier 2 and the quantized feedback circuit 4 provides an automatic amplitude control of the preamplified data signal. In a control voltage detector 6, a control voltage is derived from the data signal present at the output of the controllable amplifier 3, which voltage influences, through a control input of the controllable amplifier 3, the gain and, thus, the amplitude level of the data signal produced by the controllable amplifier 3.

The control voltage detector 6 (inside the dash-and-dot line) of FIG. 2 comprises two comparators, i.e., a non-inverting input of comparator 7 and an inverting input of comparator 8, connected to an input terminal 9. The inverting input of comparator 7 has a logic H level and the non-inverting input of comparator 8 has a logic L level. If the data signal available at the input terminal exceeds the H level, the output of comparator 7 will adopt a positive value. Similarly the output signal of comparator 8 will adopt a positive value, if the data signal available at the input terminal 9 falls below the L level. The H level and the L level can never be simultaneously exceeded and fallen short of, respectively.

If the signal available at the output of comparator 7 is positive, it is transported to an RC combination 11 across a diode 10 and subjected to a time-averaging operation. Similarly, if the signal available at the output of comparator 8, is positive, it is transported across a diode 12 and averaged with the aid of an RC combination 13. The two RC combinations 11 and 13 are connected to inputs of an AND gate 14.

The output of the AND gate 14 adopts an H level if the H level and the L level of the data signal available at the input terminal 9 are constantly exceeded and fallen short of over time respectively. (This occurs when the time-averaging of the signals at the outputs of comparators 7 and 8 exceed a specific level.) The output of the AND gate 14 is connected to an integrator which is constituted by an operational amplifier 15, a capacitor 16 arranged in the feedback branch of the operational amplifier, and a resistor 17 arranged in the input line to the inverting input of the operational amplifier 15. The non-inverting input of the operational amplifier (15 has a (H-L)/2 level. The circuitry of the integrator 15 to 17) is arranged in such a way that in the case of an H level at the output of the AND gate 14 the control voltage produced at the output (output terminal 18) of the operational amplifier 15 is reduced. Thus, the gain of the controllable amplifier 3 is reduced, and, hence, the amplitude level of the data signal at the input of the quantized feedback circuit 4 is kept constant.

Figure 3:
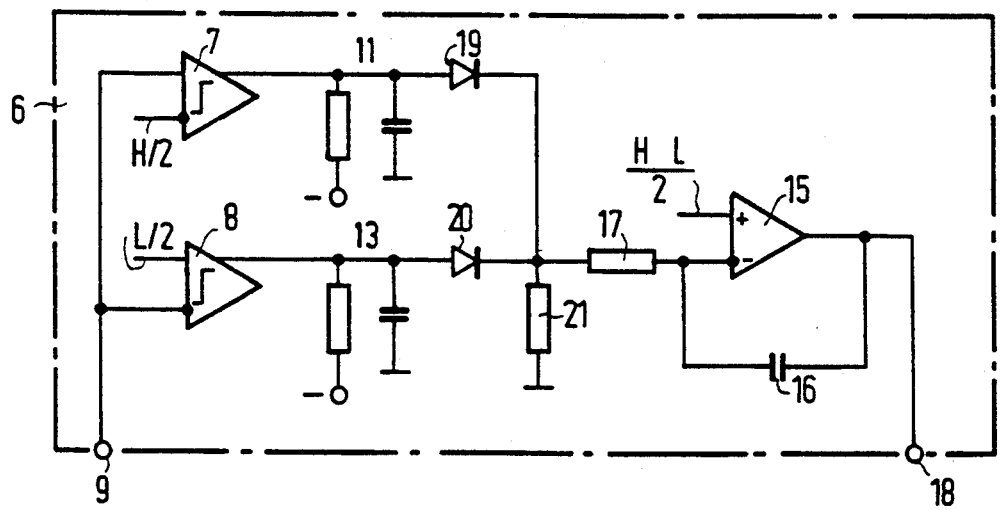
FIG. 3 shows a second embodiment of a circuit arrangement according to the invention.

FIG. 3 shows a further embodiment of the control voltage detector 6 shown in FIG. 2. Like elements are denoted there by the same reference number. Similarly, the control voltage detector 6 shown in FIG. 2, the control voltage detector 6 shown in FIG. 3 first determined, with the aid of comparators 7 and 8, whether the data signal level at terminal 9 exceeds or falls short of H/2 or L/2 levels respectively. The RC combination 11 is directly connected to a non-inverting output of the comparator 7, and the RC combination 13 is directly connected to a non-inverting output of the comparator 8. The AND gate 14 shown in FIG. 2 and used for combining the signals produced by the two comparators 7 and 8 and subsequently averaged is structured discretely in FIG. 3. A forward biased diode 19 is connected therein to the RC combination 11, and a diode 20 is connected therein to the RC combination 13. The operating point of the two diodes 19 and 20 defines a resistor 21 connected to ground potential.

In the exemplary embodiments shown in FIGS. 2 and 3, the available signal at the output of the AND gate 14 and at elements 19 to 21, respectively, is integrated in an integrator stage. If the control behavior of the amplifier 3 is to present a PI behavior, this may be achieved by connecting a resistor in parallel with the capacitor 16. It is alternatively possible to substitute an amplifier having a non-integrating frequency response for an integrator.

The circuit arrangement for automatic gain control according to the invention has been explained by way of example of an arrangement for reproducing optically transmitted data signals. It is likewise possible to utilize such an arrangement for regenerating data signals that have been read from a magnetic record carrier by way of a magnetic head, with these data signals the DC component in the data signal can be restored on the basis of the bandpass character of the head-to-tape path.

We claim:

1. A transmission system having a transmitter coupled to a receiver by way of a channel, which receiver includes a circuit arrangement for automatic gain control, said circuit arrangement comprising:

a controllable amplifier having an input for receiving a signal to be controlled, an output for presenting a controlled output signal which is absent of a dc component and a control input for receiving a control signal which causes the gain of said amplifier to adjust as a function of the control signal; and generator means for producing the control signal, said generator means including:

a first comparator for receiving the controlled output signal and presenting a first signal when the controlled output signal exceeds a specific positive level;

a second comparator for receiving the controlled output signal and presenting a second signal when the controlled output signal falls below a specific negative level;

an averaging circuit coupled to said first and second comparators for time-averaging the first signal and the second signal to produce a first average signal and a second average signal, respectively; and a combining circuit coupled to said averaging circuit for combining the first and second average signals if both the first average signal and the second average signal exceed a specific level to produce a combined output signal.

2. The transmission system as claimed in claim 1, wherein said generator means further includes an integrator stage which is coupled to said combining circuit for receiving the combined output signal and providing the control signal to said controllable amplifier via the control input.

3. The transmission system as claimed in claim 2, wherein said averaging circuit comprises a first averaging circuit for time-averaging the first signal and a second averaging circuit for time-averaging the second signal.

4. The transmission system as claimed in claim 3, wherein said combining circuit is an AND gate.

5. The transmission system as claimed in claim 1, wherein said averaging circuit comprises a first averaging circuit for time-averaging the first signal and a second averaging circuit for time-averaging the second signal.

6. The transmission system as claimed in claim 5, wherein said first and second averaging circuits each include an RC combination.

7. A receiver having a circuit arrangement for automatic gain control, said circuit arrangement comprising:

a controllable amplifier having an input for receiving a signal to be controlled, an output for presenting a controlled output signal which is absent of a dc component and a control input for receiving a control signal which causes the gain of said amplifier to adjust as a function of the control signal; and generator means for producing the control signal, said generator means including:

a first comparator for receiving the controlled output signal and presenting a first signal when the controlled output signal exceeds a specific positive level;

a second comparator for receiving the controlled output signal and presenting a second signal when the controlled output signal falls below a specific negative level;

an averaging circuit coupled to said first and second comparators for time-averaging the first signal and the second signal to produce a first average signal and a second average signal, respectively; and a combining circuit coupled to said averaging circuit for combining the first and second average signals if both the first average signal and the second average signal exceed a specific level to produce a combined output signal.

8. The receiver as claimed in claim 7, wherein said generator means further includes an integrator stage which is coupled to said combining circuit for receiving the combined output signal and providing the control signal to said controllable amplifier via the control input.

9. The receiver as claimed in claim 8, wherein said averaging circuit comprises a first averaging circuit for time-averaging the first signal and a second averaging circuit for time-averaging the second signal.

10. The receiver as claimed in claim 9, wherein said combining circuit is an AND gate.

11. The receiver as claimed in claim 7, wherein said averaging circuit comprises a first averaging circuit for time-averaging the first signal and a second averaging circuit for time-averaging the second signal.

12. The receiver as claimed in claim 11, wherein said first and second averaging circuits each include an RC combination.

13. A circuit arrangement for automatic gain control, comprising:

a controllable amplifier having an input for receiving a signal to be controlled, an output for presenting a controlled output signal which is absent of a dc component and a control input for receiving a control signal which causes the gain of said amplifier to adjust as a function of the control signal; and generator means for producing the control signal, said generator means including:

a first comparator for receiving the controlled output signal and presenting a first signal when the controlled output signal exceeds a specific positive level;

a second comparator for receiving the controlled output signal and presenting a second signal when the controlled output signal falls below a specific negative level;

an averaging circuit coupled to said first and second comparators for time-averaging the first signal and the second signal to produce a first average signal and a second average signal, respectively; and a combining circuit coupled to said averaging circuit for combining the first and second average signals if both the first average signal and the second average signal exceed a specific level to produce a combined output signal.

14. The circuit arrangement as claimed in claim 13, wherein said generator means further includes an integrator stage which is coupled to said combining circuit for receiving the combined output signal and providing the control signal to said controllable amplifier via the control input.

15. The circuit arrangement as claimed in claim 13, wherein said combining circuit is an AND gate.

16. The circuit arrangement as claimed in claim 13, wherein said averaging circuit comprises a first averaging circuit for time-averaging the first signal and a second averaging circuit for time-averaging the second signal.

17. The circuit arrangement as claimed in claim 16, wherein said first and second averaging circuits each include an RC combination.

18. The circuit arrangement as claimed in claim 16, wherein said combining circuit is an AND gate.

19. The circuit arrangement as claimed in claim 14, wherein said averaging circuit comprises a first averaging circuit for time-averaging the first signal and a second averaging circuit for time-averaging the second signal.

20. The circuit arrangement as claimed in claim 19, wherein said first and second averaging circuits each include an RC combination.

21. The circuit arrangement as claimed in claim 19, wherein said combining circuit is an AND gate.

* * * * *